US008604458B2

(12) United States Patent
Suga et al.

(10) Patent No.: US 8,604,458 B2
(45) Date of Patent: Dec. 10, 2013

(54) TWO-TERMINAL RESISTANCE SWITCHING DEVICE AND SEMICONDUCTOR DEVICE

(75) Inventors: Hiroshi Suga, Tsukuba (JP); Yasuhisa Naitou, Tsukuba (JP); Masayo Horikawa, Tsukuba (JP); Tetsuo Shimizu, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 457 days.

(21) Appl. No.: 12/671,145

(22) PCT Filed: Jul. 23, 2008

(86) PCT No.: PCT/JP2008/063176
§ 371 (c)(1),
(2), (4) Date: Jan. 28, 2010

(87) PCT Pub. No.: WO2009/019980
PCT Pub. Date: Feb. 12, 2009

(65) Prior Publication Data
US 2010/0193757 A1 Aug. 5, 2010

(30) Foreign Application Priority Data
Aug. 9, 2007 (JP) ................................. 2007-207397

(51) Int. Cl.
*H01L 29/06* (2006.01)
(52) U.S. Cl.
USPC ................................................ 257/9; 257/2
(58) Field of Classification Search
USPC ............................................................ 257/9
See application file for complete search history.

(56) References Cited

U.S. PATENT DOCUMENTS

2007/0037414 A1 2/2007 Yamauchi et al.
2009/0251199 A1 10/2009 Naitoh et al.

FOREIGN PATENT DOCUMENTS

| JP | 2005-79335 A | 3/2005 |
| JP | 2005-175164 A | 6/2005 |
| JP | 2006-128438 A | 5/2006 |
| JP | 2007-49084 A | 2/2007 |
| JP | 2007-123828 A | 5/2007 |

OTHER PUBLICATIONS

Terabe et al., "Quantized Conductance Atomic Switch", Nature, vol. 433, No. 6, pp. 47-50, Jan. 6, 2005.
Collier et al., "A [2] Catenane-Based Solid State Electronically Reconfigurable Switch", Science, vol. 289, pp. 1172-1175, Aug. 18, 2000.
Naitoh et al., "Resistance Switch Employing a Simple Metal Nanogap Junction", Nanotechnology, vol. 17, pp. 5669-5674, 2006.
International Search Report issued in PCT/JP2008/063176, issued Oct. 28, 2008, 4 pages.

*Primary Examiner* — Long Pham
(74) *Attorney, Agent, or Firm* — Birch, Stewart, Kolasch & Birch, LLP

(57) ABSTRACT

The present invention is contemplated for providing a resistance switching device having a very small device size of approximately 20 nm×20 nm in its entirety, by taking advantage of a small diameter of a multilayered carbon nanotube or a multilayered carbon nanofiber per se, via a simpler manner that does not require any molecule inclusion step, with an excellent electric conductivity. Provided is a two-terminal resistance switching device, which has multilayered carbon nanofibers or multilayered carbon nanotubes disposed with a nano-scale gap width therebetween.

14 Claims, 2 Drawing Sheets

TWO-TERMINAL RESISTANCE SWITCHING DEVICE AND SEMICONDUCTOR DEVICE

TECHNICAL FIELD

The present invention relates to a two-terminal resistance switching device, particularly, a two-terminal resistance switching device using a multilayered carbon nanotube or a multilayered carbon nanofiber, and to a semiconductor device.

BACKGROUND ART

At present, electric devices have been made as small as possible in their device sizes, and an individual device has become approaching the smallest size limit thereof. In the case of, for example, CMOSs, which are current leading memory devices, it is expected that the minimum value of their channel length permitting their functions to be expressed would be 6 nm. In order to develop new techniques exceeding this limit, the development of new devices has been advanced on the basis of various ideas throughout the world.

For example, with respect to memory devices, two-terminal resistance switching devices have been researched, in which a large change in resistance is generated between on-states and off-states of the devices through the migration of atoms or a change in property of molecules. Typical examples thereof will be introduced hereinafter.

A technique introduced in the following Non-Patent Literature 1 is a technique of utilizing an electrochemical reaction between a silver sulfide electrode and a platinum electrode, to stretch and shrink silver particles, to control, through the silver atoms, the bridging and breaking between the electrodes, thereby realizing an atomic switch.

A technique introduced in Non-Patent Literature 2 is a technique of utilizing a redox reaction of catenane-series molecules and inducing the redox reaction of the molecules by a voltage, so as to open a channel, thereby realizing a switching device.

As described above, in recent years, reports have been made on switching devices utilizing the stretching and shrinking of a small number of metal atoms or a redox reaction of molecules.

As illustrated in FIG. 1, the inventors of the present invention proposed a two-terminal resistance switching device in which a voltage is applied to metallic electrodes with a nano-scale gap width across the electrodes (Patent Literature 1, Non-Patent Literature 3). The technique proposed in those literatures is a technique of applying a voltage to gold electrodes with a gap width of about 0.1 nm to 20 nm across the electrodes so as to control the gap width. It is demonstrated that, according to this technique, the resistance value of the gap portion can be controlled and the device can be applied as a non-volatile memory, utilizing the control of the gap width.

Further, the inventors of the present invention manufactured a gap electrode having an air gap width of 20 nm or smaller by using a carbon nanotube, to thereby try to manufacture a switching device in a region area that is far smaller than a limit wiring width (45 nm) of a current silicon process. It was confirmed that a switching phenomenon certainly does not occur in a case of using a simple single-layer carbon nanotube as a material of the electrode, whereas the switching phenomenon occurs with high probability in a case of using a single-layer carbon nanotube including fullerene molecules (C60) or carotene molecules as the material of the electrode. However, in manufacturing a switching device by using the carbon nanotube including fullerene molecules or carotene molecules, it is necessary to perform a step of causing the carbon nanotube to include those molecules, which leads to a problem in terms of manufacturing efficiency. Moreover, some single-layer carbon nanotubes have a property of a semiconductor whereas other single-layer carbon nanotubes have a property of a metal, but it is extremely expensive to perform refinement for sorting out only the single-layer carbon nanotubes having the property of a metal, which are suitable for use as an electrode. Furthermore, there is also a problem that the single-layer carbon nanotube is vulnerable to heat and oxidation.

Patent Literature 1: Japanese Patent Application No. 2006-189380 (JP-A-2007-123828 ("JP-A" means unexamined published Japanese patent application))

Non-Patent Literature 1: Nature 433, (2005) 47-50.

Non-Patent Literature 2: SCIENCE 289, (2000) 1172-1175.

Non-Patent Literature 3: Nanotechnology 17, (2007) 5669-5674.

DISCLOSURE OF INVENTION

Technical Problem

The present invention is contemplated for providing a resistance switching device having a very small device size of approximately 20 nm×20 nm in its entirety, by taking advantage of a small diameter of a multilayered carbon nanotube or a multilayered carbon nanofiber per se, via a simpler manner that does not require any molecule inclusion step, with an excellent electric conductivity.

Solution to Problem

The above-mentioned problem is solved by the following means.

(1) A two-terminal resistance switching device, comprising multilayered carbon nanofibers disposed with a nano-scale gap width therebetween.

(2) The two-terminal resistance switching device according to Item (1), wherein the multilayered carbon nanofibers disposed with the gap width therebetween each have an electrode.

(3) A two-terminal resistance switching device, comprising multilayered carbon nanotubes disposed with a nano-scale gap width therebetween.

(4) The two-terminal resistance switching device according to Item (3), wherein the multilayered carbon nanotubes disposed with the gap width therebetween each have an electrode.

(5) The two-terminal resistance switching device according to any one of Items (1) to (4), wherein the gap width is within a range from 0.1 nm to 20 nm.

(6) A semiconductor device, having the two-terminal resistance switching device according to any one of Items (1) to (5) built therein.

Advantageous Effects of Invention

The present invention adopts the multilayered carbon nanotube or the multilayered carbon nanofiber, which may be synthesized in large amounts by chemical vapor deposition (CVD), and does not require the molecule inclusion step. Moreover, there are advantages that the multilayered carbon nanotube is so excellent in both electric conduction and heat conduction as to be expected as next-generation LSI wiring, and is capable of causing a larger current to flow therethrough than a single-layer carbon nanotube.

BEST MODE FOR CARRYING OUT THE INVENTION

In the two-terminal resistance switching device of the present invention, a voltage is applied to multilayered carbon nanotubes that face each other at a nano-size scale, to thereby realize an electrical switch. The two-terminal resistance switching device is turned on when the applied voltage is caused to approach 0 V slowly, and conversely is turned off when the applied voltage is caused to approach 0 V instantaneously.

Figure 1:
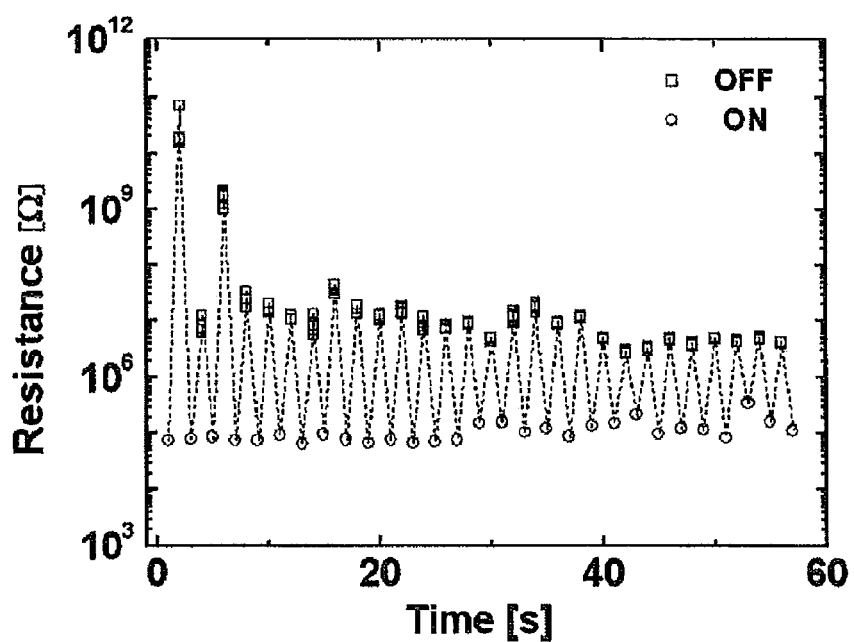
FIG. 1 is a graph illustrating a change in device resistance when a change between an on-state and an off-state is repeated.

FIG. 1 illustrates a change in device resistance when a change between an on-state and an off-state is repeated. It is understood that the two-terminal resistance switching device has two resistance states, that is, an on-state of about 500 kΩ and an off-state of about 10 MΩ. By changing how to lower the applied voltage from a state where a voltage of +12 V is applied to the device, the two different types of resistance values can be obtained, separately.

The low on-resistance (about 500 kΩ) is realized, by lowering the voltage from +12 V to 0 V slowly (for example, a change speed of the voltage is about 1 V/s). The high off-resistance (about 10 MΩ) is realized, by lowering the voltage from +12 V to 0 V instantaneously (the change speed of the voltage is about 0.2 V/1 µs).

It should be noted that the gap width between the carbon nanotubes may fall within a range of from 0.1 nm to 20 nm.

As described above, the device can have the two types of resistances, by changing how to apply an electric field. Each of the resistance states maintains a given resistance in a low voltage region, and hence the change between the resistance states is nonvolatile. Further, the change between the on-state and the off-state is reversible, and even when measurement is repeatedly performed on the same device 200 times or more, the device still exhibits the same switching characteristics.

Figure 2:
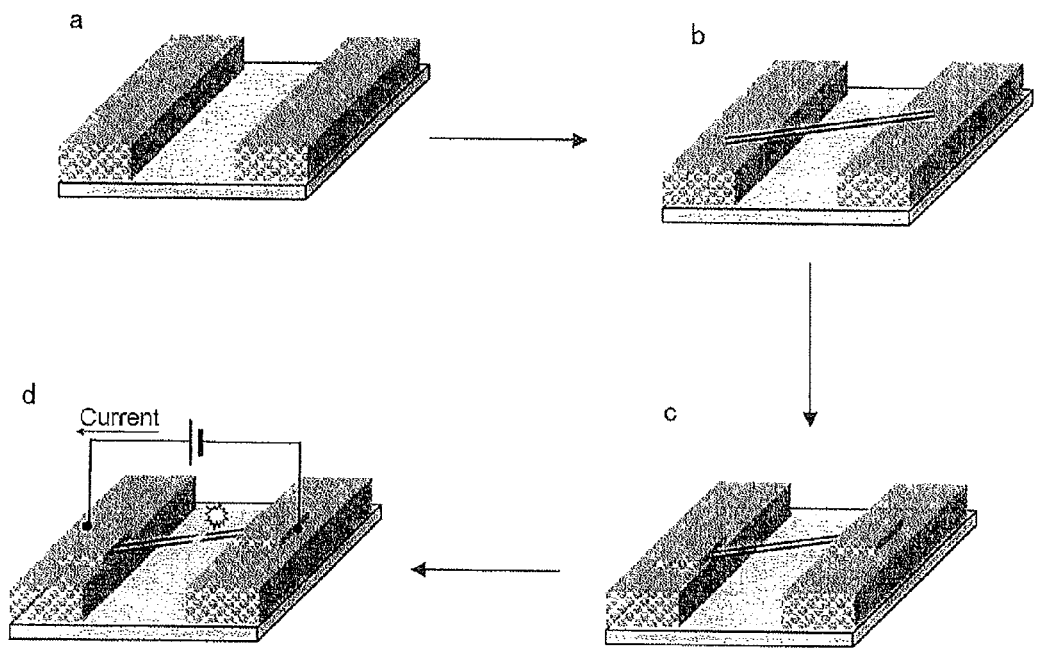
FIG. 2 is a view illustrating a manufacturing process of a sample.

FIG. 2 is a schematic view illustrating a manufacturing method of a sample. As illustrated in FIG. 2a, metallic electrodes containing gold or palladium are deposited on a silicon substrate having a silicon oxide layer, with a gap width of about 650 nm to 1 µm by using a metal mask. As illustrated in FIG. 2b, one multilayered carbon nanotube is bridged on between the electrodes by using a precise manipulator that is incorporated in a sample chamber of a scanning electron microscope (SEM).

Figure 3:
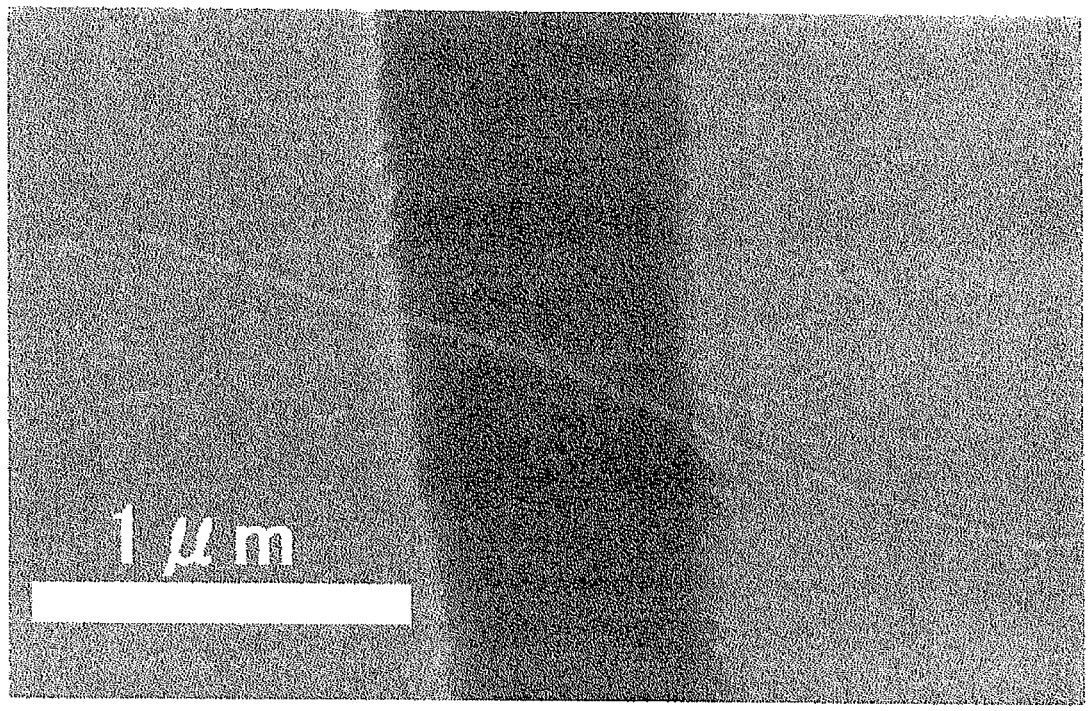
FIG. 3 is an image of a manufactured sample taken by a scanning electron microscope.

FIG. 3 is an image of the electrodes taken by the scanning electron microscope after the multilayered carbon nanotube is bridged therebetween.

Then, the sample is heated at 500° C. for 24 hours in a nitrogen atmosphere, to thereby cause metal atoms to migrate on the carbon nanotube, and then a resistance at an interface between the carbon nanotube and the metallic electrodes is stabilized at approximately 20 kΩ (FIG. 2c). Finally, as illustrated in FIG. 2d, a current of several tens of µA or higher is caused to flow through the nanotube between the electrodes, to thereby cut the nanotube. A gap width between the nanotubes that are cut at this time is as small as several nm. In this way, a structure in which the multilayered carbon nanotubes face each other at the nano-size scale is manufactured. Otherwise, a local defect structure having a high resistance is formed in part of the multilayered carbon nanotubes.

It should be noted that the above-mentioned embodiment is given merely for easy understanding of the present invention, and the present invention should not be limited to the embodiment. That is, modifications and other embodiments based on the technical idea of the present invention are naturally encompassed in the present invention.

For example, the multilayered carbon nanotube is described as an example in the embodiment, but a carbon nanofiber or the like having a structure with two or more layers can be employed, to form another embodiment of the resistance switching device.

Further, it is clear from the above that a semiconductor device can be obtained by incorporating the two-terminal resistance switching device of the present invention into a memory, a storage device, or the like.

The invention claimed is:

1. A two-terminal resistance switching device, comprising:
    a substrate;
    electrodes disposed on the substrate, opposing each other, and
    a carbon member disposed bridging on between the electrodes,
    wherein the carbon member has a local defect structure with a width from 0.1 nm to 20 nm, and a resistance is variable at the local defect structure based on a voltage applied to the electrodes.

2. The two-terminal resistance switching device according to claim 1, wherein the carbon member is a multilayered carbon nanotube with two or more layers or a multilayer carbon nanofiber with two or more layers.

3. A semiconductor device comprising the two-terminal resistance switching device according to claim 1.

4. The two-terminal resistance switching device according to claim 1, wherein the two-terminal resistance switching device has two resistance states.

5. The two-terminal resistance switching device according to claim 4, wherein the two resistance states are an on-state of about 500 kΩ and an off-state of about 10 MΩ.

6. The two-terminal resistance switching device according to claim 5, wherein a change between the two resistance states is nonvolatile and reversible.

7. The two-terminal resistance switching device according to claim 1, wherein the local defect structure is formed on one carbon member.

8. The two-terminal resistance switching device according to claim 1, wherein the local defect structure is formed from a part of a carbon material forming the carbon member.

9. The two-terminal resistance switching device according to claim 1, wherein the carbon member is a multilayered carbon nanotube and the local defect is an area having a high resistance formed in part of the multilayered carbon nanotube.

10. The two-terminal resistance switching device according to claim 5, wherein the on-state is achieved by lowering the voltage to 0 V slowly, and the off-state is achieved by lowering the voltage to 0 V instantaneously.

11. A two-terminal resistance switching device, comprising:
    a substrate;
    at least two electrodes disposed on the substrate, opposing each other, and without contacting each other, and a carbon member disposed horizontally from one of the at least two electrodes to another of the at least two electrodes, such that the carbon member bridges the at least two electrodes, wherein the carbon member has a local defect structure with a width from 0.1 nm to 20 nm, and a resistance is variable at the local defect structure based on a voltage applied to the electrodes.

12. The two-terminal resistance switching device according to claim 11, wherein the carbon member is a multilayered carbon nanotube and the local defect is an area having a high resistance formed in part of the multilayered carbon nanotube.

13. The two-terminal resistance switching device according to claim 1, wherein the device has a space which is provided between the carbon member and the substrate.

14. The two-terminal resistance switching device according to claim 11, wherein the device has a space which is provided between the carbon member and the substrate.

* * * * *